(12) United States Patent
Han et al.

(10) Patent No.: US 7,679,161 B2
(45) Date of Patent: Mar. 16, 2010

(54) SEMICONDUCTOR DEVICE COMPRISING FUSE SECTIONS

(75) Inventors: Myoung-Hee Han, Gyeonggi-do (KR); Jong-Seop Lee, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 386 days.

(21) Appl. No.: 11/552,928

(22) Filed: Oct. 25, 2006

(65) Prior Publication Data

US 2007/0096251 A1     May 3, 2007

(30) Foreign Application Priority Data

Oct. 27, 2005   (KR) .................. 10-2005-0101983

(51) Int. Cl.
    *H01L 23/62*  (2006.01)
(52) U.S. Cl. ............. 257/529; 257/209; 257/E23.149
(58) Field of Classification Search ........... 257/209, 257/529, E23.149
    See application file for complete search history.

(56) References Cited

U.S. PATENT DOCUMENTS 6,172,896 B1 *   1/2001   Lee ........................... 365/96
6,682,959 B2 *   1/2004   Bang et al. ................. 438/132
6,720,591 B2 *   4/2004   Miyamoto et al. .......... 257/209

FOREIGN PATENT DOCUMENTS

| JP | 09-172087 | 6/1997 |
| JP | 2003-142582 | 5/2003 |
| KR | 2002-0024460 | 3/2002 |

OTHER PUBLICATIONS

English language abstract for Korean Publication No. 2002-0024460, Mar. 30, 2002.
English language abstract for Korean Publication No. 09-172087, Jun. 30, 1997.
English language abstract for Japanese Publication No. 2003-142582, May 16, 2003.

* cited by examiner

*Primary Examiner*—Marcos D. Pizarro
*Assistant Examiner*—Tifney L Skyles

(57) ABSTRACT

In an embodiment, a semiconductor device includes a first fuse cutting portion in which fuse lines are arranged transversely adjacent to each other, a first runner portion in which runner lines connected to the fuse lines are arranged transversely adjacent to each other but at smaller intervals than those of the fuse lines, and a first connection portion having connection lines between the fuse lines and the runner lines. An insulating barrier layer covers the connection portions so that post-process residues from fuse cutting do not cause electrical shorts between the closely formed runner lines.

8 Claims, 5 Drawing Sheets

SEMICONDUCTOR DEVICE COMPRISING
FUSE SECTIONS

CROSS-REFERENCE TO RELATED
APPLICATION

This application is based on, and claims priority from, Korean Patent Application No. 10-2005-0101983, filed on Oct. 27, 2005, the disclosure of which is incorporated herein in its entirety by reference.

BACKGROUND OF THE INVENTION

1. Field of the Invention

The present invention relates to a semiconductor device and a method of its fabrication, and more particularly to a semiconductor device that can prevent the occurrence of residue during a repair process, and a method of its fabrication.

2. Description of the Prior Art

In general, a semiconductor device is manufactured by performing a fabrication (FAB) process. For example, a predetermined circuit pattern is repeatedly formed on a substrate to form cells having an integrated circuit. Then an assembly process in which the substrate formed with the cells is packaged into a chip.

Also, an electrical die sorting (EDS) process for examining electrical properties of the cells formed on the substrate may be performed between the FAB process and the assembly process.

Through such an examination process defective cells can be found. And defective cells are replaced with prefabricated redundancy cells by performing a repair process. Thus, all the cells operate normally during actual chip operation, which makes it possible to enhance the yield of the semiconductor device.

In the repair process, a laser beam is irradiated onto a wiring portion connected to the defective cell, thereby breaking off the wiring portion. The wiring to be broken off by the laser beam is called a fuse, and a region in which the fuses cluster together is called a fuse region.

As the integration of semiconductor devices increases, a metal wiring or an electrically conductive layer for a capacitor electrode, which is located in a relatively upper portion within a semiconductor device, is used as the fuse. However, the metal wiring or the electrically conductive layer used as the conventional fuse is problematic in that post-process residues may occur during the repair process, which may cause a leakage current in the semiconductor device.

SUMMARY

Accordingly, embodiments herein have been made to solve the above-mentioned problems occurring in the prior art, and an object is to provide a semiconductor device, the reliability of which can be enhanced by reducing the occurrence of a defect during a repair process of the semiconductor device.

A further object is to provide a semiconductor device manufacturing method.

It should be appreciated that objects and embodiments are not limited to those as mentioned, and others not mentioned herein will be apparent to those skilled in the art from the following description.

To accomplish the above-mentioned objects, in accordance with one aspect, a semiconductor device includes a first fuse section including a first fuse cutting portion in which fuse lines are arranged transversely adjacent to each other, a first runner portion in which runner lines connected to the fuse lines are arranged transversely adjacent to each other but at smaller intervals than those of the fuse lines, and a first connection portion having connection lines between the fuse lines and the runner lines; a second fuse section including a second fuse cutting portion which is transversely adjacent to the first runner portion, a second runner portion which is transversely adjacent to the first fuse cutting portion, and a second connection portion interconnecting the second fuse cutting portion and the second runner portion; and a first insulating barrier layer covering the first and second connection portions.

In accordance with another aspect, a method of fabricating a semiconductor device includes forming first and second fuse sections, the first fuse section including a first fuse cutting portion in which fuse lines are arranged transversely adjacent to each other, a first runner portion in which runner lines connected to the fuse lines are arranged transversely adjacent to each other but at smaller intervals than those of the fuse lines, and a first connection portion having connection lines between the fuse lines and the runner lines, the second fuse section including a second fuse cutting portion which is transversely adjacent to the first runner portion, a second runner portion which is transversely adjacent to the first fuse cutting portion, and a second connection portion interconnecting the second fuse cutting portion and the second runner portion; and forming a first insulating barrier layer covering the first and second connection portions.

Other detailed aspects and embodiments are included in the following description and the accompanying drawings.

BRIEF DESCRIPTION OF THE DRAWINGS

The above and other objects, features and advantages will become apparent from the following detailed description taken in conjunction with the accompanying drawings, in which.

Figure 1:
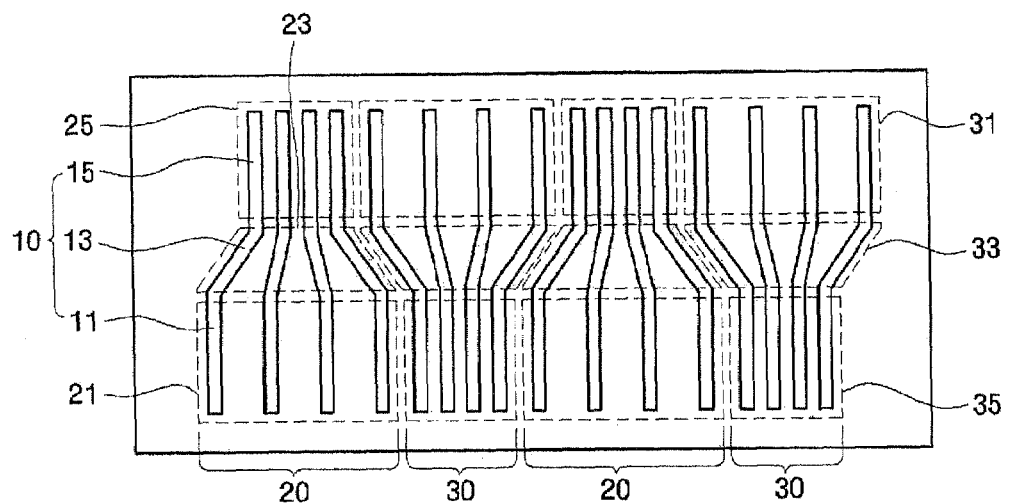
FIG. 1 is a view illustrating a layout of each fuse section of a semiconductor device in accordance with a preferred embodiment.

DETAILED DESCRIPTION OF THE PREFERRED
EMBODIMENTS

Advantages and features of the present invention, and ways to achieve them will be apparent from embodiments, as will be described below together with the accompanying drawings. However, the scope of the present invention is not limited to such embodiments and the present invention may be realized in various forms. The embodiments described below are provided to properly disclose the present invention and assist those skilled in the art to completely understand the present invention. The present invention is defined only by the scope of the appended claims. Also, the same reference numerals are used to designate the same elements throughout the specification and drawings.

In the specification, embodiments of the present invention will be described with reference to sectional views and/or plane views corresponding to ideal illustrative views of the present invention. Such illustrative views may alter in form according to fabrication techniques and/or tolerances and others. Therefore, the embodiments of the present invention are not limited to the specific forms shown in the accompanying drawings, but include all changes in form occurring during the fabrication processes. For example, an etched area shown as having a rectangular shape may be formed to have a rounded shape or a predetermined curvature. Thus, areas illustrated in the accompanying drawings are only exemplary, and the shapes of these areas are not intended to limit the scope of the invention, but are intended to exemplify specific forms of device areas.

FIG. 1 schematically illustrates a layout of a fuse region that may be used in a semiconductor device according to a preferred embodiment. Referring to FIG. 1, the fuse region includes a first fuse section 20 and a second fuse section 30, in which a plurality of fuses 10 are formed transversely adjacent to each other. In other words, each of the fuses 10 are adjacent to each other and lie across the fuse sections 20 and 30. Here, each fuse 10 includes a fuse line 11 that may be cut by fuse cutting techniques such as a laser beam during a repair process, a runner line 15 that is not cut during the repair process and that transfers a signal of the fuse line, and a connection line 13 that interconnects the fuse line 11 and the runner line 15.

The fuse lines 11 are formed at predetermined intervals to minimize defects when they are cut, and the runner lines 15 are arranged at smaller intervals than those of the fuse lines 11.

The first fuse section 20 includes a first fuse cutting portion 21, a first runner portion 25, and a first connection portion 23. Here, the first fuse cutting portion refers to a portion in which the plurality of fuse lines 11 to be cut by fuse cutting techniques such as a laser beam during the repair process are formed transversely adjacent to each other. Also, the first runner portion 25 refers to a portion in which the plurality of runner lines 15, paths connected to the fuse lines 11 to transfer signals of the fuse lines 11, are formed transversely adjacent to each other. In addition, the first connection portion 23 refers to a portion in which the plurality of connection lines 13 interconnecting the fuse lines 11 and the runner lines 15 are included.

The second fuse section 30 has substantially the same structure as that of the first fuse section 20, and includes a second fuse cutting portion 31, a second runner portion 35, and a second connection portion 33. Here, the first fuse section 20 and the second fuse section 30 may be arranged so that the fuse cutting portions of the first and second fuse sections are oriented in an opposite direction to each other. That is, the first fuse section 20 and the second fuse section 30 may be formed in such a manner that the first runner portion 25 is transversely adjacent to the second fuse cutting portion 31, the first fuse cutting portion 21 is transversely adjacent to the second runner portion 35, and the first connection portion 23 is transversely adjacent to the second connection portion 33. Further, the first and second fuse sections 20, 30 may be alternately arranged so that the second fuse section 30 is transversely adjacent to a further first fuse section and, in turn, the further first fuse section is transversely adjacent to a further second fuse section. In this way, the fuse cutting portions and the runner portions are alternately and repeatedly located in a transverse direction, which may correspond to a structure for reducing the size of the semiconductor device by maximizing spatial efficiency.

In the specification, the structure shown in FIG. 1, in which a fuse cutting portion and a runner portion of different fuse sections are formed transversely adjacent to each other, is referred to as a "double fuse". Further, by transversely arranging a further fuse section including a fuse cutting portion in another region, a triple fuse or a higher multiple fuse may be realized.

Hereinafter, for explanatory convenience, the embodiments of the present invention will be described using the double fuse structure. However, it should be obvious that the embodiments are not limited to the double fuse structure, but can be applied to the triple or a higher multiple fuse structure. Also, as a matter of convenience, fuses are described as formed of the same film material as that of a first wiring in the following embodiments, but this is not limiting, and the fuses may be formed of the same film material as that of a second wiring or other wiring located above the second wiring.

Figure 2:
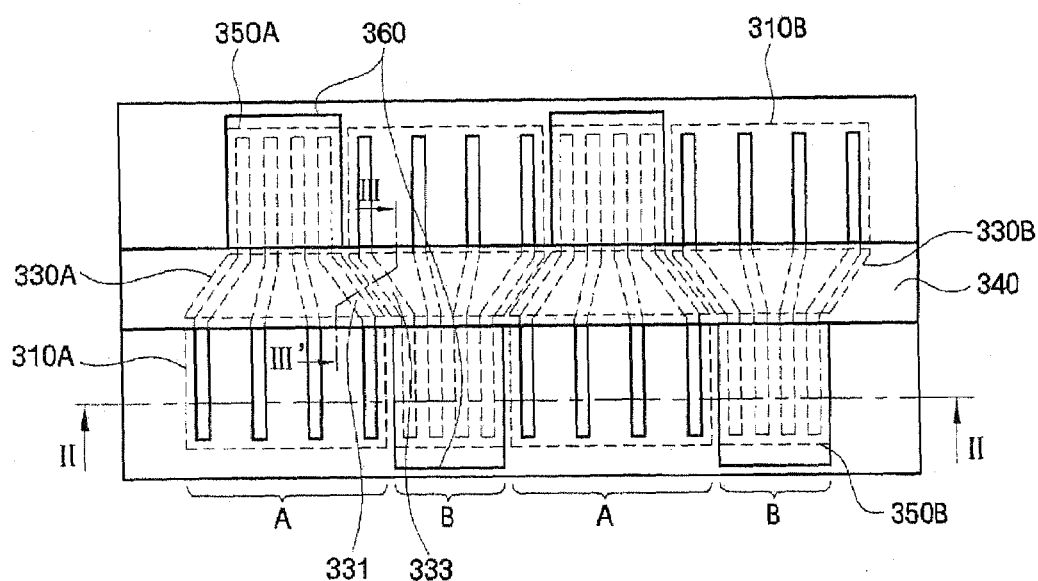
FIG. 2 is a view illustrating a layout of a fuse region of a semiconductor device in accordance with a preferred embodiment.
Figure 3A:
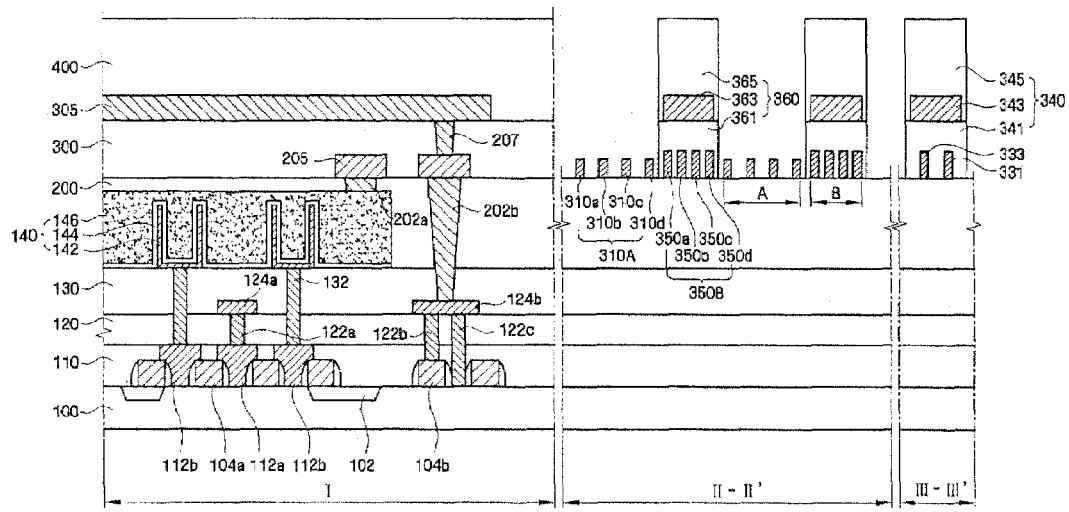
FIGS. 3A and 3B are cross-sectional views of semiconductor devices in accordance with preferred embodiments.
Figure 3B:
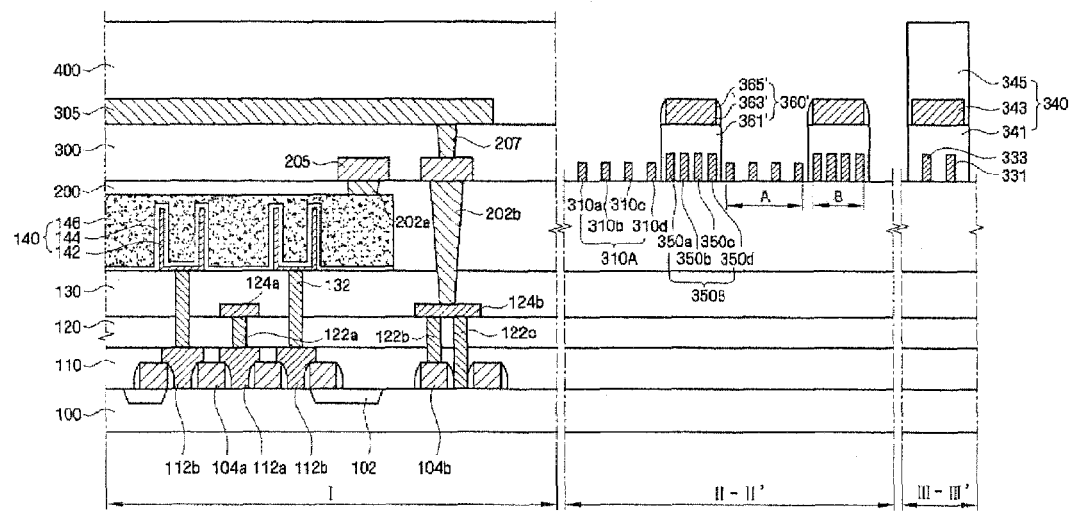

FIG. 2 schematically illustrates a layout of a fuse region of a semiconductor device according to a preferred embodiment, and FIGS. 3A and 3B illustrate cross-sectional views of semiconductor devices according to preferred embodiments. In FIGS. 3A and 3B, area I represents a cell array area, area II-II' represents a cross-sectional plane of the fuse region taken along line II-II' in FIG. 2, and area III-III' represents a cross-sectional plane of the fuse region taken along line III-III' in FIG. 2.

As illustrated in FIG. 2, a semiconductor device, according to a preferred embodiment, includes a first fuse section A and a second fuse section B in a fuse region, and also includes a first insulating barrier layer 340 that covers a first connection portion 330A of the first fuse section A and a second connection portion 330B of the second fuse section B. The first insulating barrier layer 340 contains the first connection portion 330A and the second connection portion 330B in the inside thereof, and insulates the respective connection lines 331, 333. Thus, it can prevent a short circuit between the fuses, which may occur due to residues of fuse cutting portions 310A and 310B, or cut-off fuse materials in the connection portions formed with the connection lines having smaller intervals than those of the fuse cutting portions 310A and 310B.

To be specific, referring to FIG. 3A, the first insulating barrier layer 340 includes a first insulating film pattern portion 341 for insulating the connection lines 331, 333 contained in the first and second connection portions 330A, 330B. For example, by further disposing an electrically conductive film pattern portion 343 and a second insulating film pattern portion 345 surrounding the electrically conductive film pattern portion 343 on the first insulating film pattern portion 341, the first insulating barrier layer 340 can be constructed to a predetermined height.

At this time, the fuse sections A, B may be formed of, for example, the same film material as that of a first wiring 205 formed on a fourth interlayer insulating film 200 in the cell array area I. By way of illustration, aluminum, tungsten, copper or the like may be used as the material of the fuse sections and, among others, aluminum having excellent waterproofness is preferably used. Also, the first insulating film pattern portion 341 may be formed of, for example, the same film material as that of a fifth interlayer insulating film 300 in the cell array area I, and the electrically conductive film pattern portion 343 may be formed of, for example, the same film material as that of a second wiring 305 in the cell array area I. Moreover, the second insulating film pattern portion 345 may be formed of, for example, the same film material as that of a protection film, that is, a passivation layer 400, in the cell array area I.

In addition, as illustrated in FIG. 2, the semiconductor device, according to the preferred embodiment, may be formed so that it contains first runner portion 350A and second runner portion 350B, each of which include respective runner lines 350*a*, 350*b*, 350*c*, and 350*d*. The semiconductor device may further include a second insulating barrier layer 360 for insulating the respective runner lines. Since the runner lines are generally formed at smaller intervals than those of the fuse lines, there is a concern that short-circuits between the fuses may occur due to residues generated when the fuses are cut. But by providing the second insulating barrier layer 360 for insulating the respective runner lines in this way, the semiconductor device according to this embodiment can minimize the occurrence of defects caused by the residues during the fuse cutting.

In the embodiment shown in FIG. 3A, the second insulating barrier layer 360 includes a first insulating film pattern portion 361 for insulating the respective runner lines 350*a*, 350*b*, 350*c*, 350*d*. Such a first insulating film pattern portion 361 may be formed of, for example, the same film material as that of the fifth interlayer insulating film 300. Also, an electrically conductive film pattern portion 363 is further formed on the first insulating film pattern portion 361, and the electrically conductive film pattern portion 363 may be surrounded by a second insulating film pattern portion 365 on its side and top surfaces. Here, the electrically conductive film pattern portion 363 may be formed of the same film material as that of the second wiring 305, and the second insulating film pattern portion 365 may be formed of the same film material as that of the protection film, that is, the passivation layer 400.

Meanwhile, as illustrated in the embodiment of FIG. 3B, the second insulating film pattern portion 365' of the second insulating barrier layer 360' may be formed so that the electrically conductive film pattern portion 363' is exposed on its top surface. In addition to this, the electrically conductive film pattern portion 363' of the second insulating barrier layer 360' may be formed at a lower level than the electrically conductive film pattern portion 343 of the first insulating barrier layer 340. Besides such a structure of the second insulating barrier layer 360', other components are substantially the same as those described with reference to FIG. 3A, so a repetitive description thereof will be omitted here.

Hereinafter, a brief description will be given for the cell array area I shown in FIG. 3A. Of course, this cell array area is only illustrative, and thus may be appropriately modified.

As illustrated in FIG. 3A, in the cell array area I, a device isolation film 102 for isolating an active area and a field area is formed on a substrate 100, and gate electrodes 104*a*, 104*b* are disposed on the substrate 100 in the cell array area and a peripheral circuit area, respectively. Also, an impurity area (not shown) is located in the substrate 100 between the gate electrodes 104*a*, 104*b*.

A first interlayer insulating film 110 covering the gate electrodes 104*a*, 104*b* is disposed over the gate electrodes 104*a*, 104*b*, and not only a bit line contact pad 112*a* for electrically interconnecting the impurity area (not shown) and a bit line 124*a*, but also a lower electrode contact pad 112*b* for electrically interconnecting the impurity area (not shown) and a lower electrode 142 of a capacitor 140 are formed within the first interlayer insulating film 110.

On the first interlayer insulating film 110, there is disposed a second interlayer insulating film 120 that contains a bit line contact 122*a* for electrically interconnecting the bit line contact pad 112*a* and the bit line 124*a*. Also, in the peripheral circuit area, contacts 122*b*, 122*c* for interconnecting a peripheral circuit area wiring 124*b* to the gate electrode 104*b* and the impurity area (not shown), respectively, are formed within the first and second interlayer insulating films 110, 120.

On the second interlayer insulating film 120, there is disposed a third interlayer insulating film 130 that contains the bit line 124*a* connected to the bit line contact 122*a*, and the wiring 124*b* connected to the contacts 122*b*, 122*c* in the peripheral circuit area. Also, a lower electrode contact 132 for interconnecting the lower electrode 142 and the lower electrode contact pad 112*b* located within the first interlayer insulating film 110 is formed within the second and third interlayer insulating films 120, 230 in the cell array area.

On the third interlayer insulating film 130, there is disposed a cylinder-type capacitor 140 that includes the lower electrode 142 electrically connected to the lower electrode contact 132, a dielectric film 144 conformally formed along the lower electrode 142, and an upper electrode 146. The capacitor 140 may be of other types such as a stack type. A fourth interlayer insulating film 200 is further disposed on the capacitor 140.

In addition, a first wiring 205 and a fifth interlayer insulating film 300 covering the first wiring 205 are disposed on the fourth interlayer insulating film 200 in the cell array area. A second wiring 305 is formed on the fifth interlayer insulating film 300, and a via 207 for interconnecting the first and second wirings 205, 305 is disposed within the fifth interlayer insulating film 300. Finally, a passivation layer 400 as a protection layer is disposed over the second wiring 305.

Hereinafter, a semiconductor fabrication method according to a preferred embodiment will be described by way of example. In the following explanation of this fabrication method, processes capable of being implemented according to process steps well known those skilled in the art will be generally described to avoid the embodiments from being ambiguously construed.

Figure 4A:
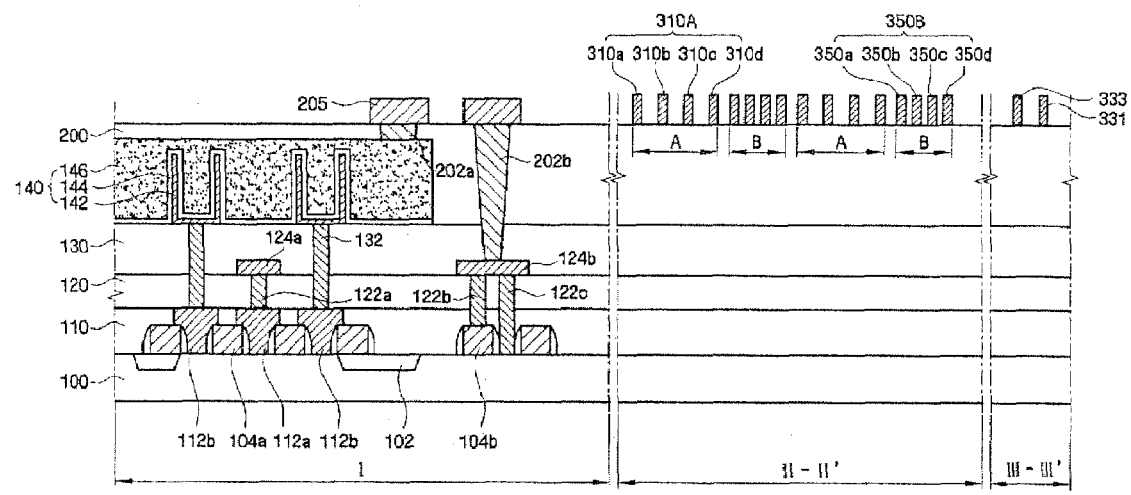
FIGS. 4A to 4E are cross-sectional views sequentially illustrating a method of fabricating the semiconductor device shown in FIG. 3A.

First, as illustrated in FIG. 4A, a first fuse section A and a second fuse section B are formed on a fourth interlayer insulating film 200 covering a capacitor 140 in a cell array area I, as mentioned above. The first fuse section A and the second fuse section B may be formed as an electrically conductive film, the material of which is the same as film material of a first wiring 205 on the fourth interlayer insulating film 200. For example, the fuse sections A, B may consist of metal wiring material such as aluminum (Al), tungsten (W), or copper (Cu). But aluminum is preferably used as the material of the fuse sections A, B.

Although the drawings are illustrated in sequence, semiconductor fabrication prior to the formation of the fuse sections in FIG. 4 may be implemented according to a common process sequence as will be illustratively described below.

First, a device isolation process for isolating each of the memory cells on a substrate 100 is carried out to form a device isolation film 102. As a result of this, the substrate 100 can be divided into an active area and a field area. A process used as the device isolation process may be a LOCOS (Local Oxidation of Silicon) process or an STI (Shallow Trench Isolation) process.

Also, using common formation techniques, gate electrodes 104*a*, 104*b* are formed on the substrate 100 having been formed with the device isolation film 102. At this time, the gate electrodes 104*a*, 104*b* are disposed in the cell array area and a peripheral circuit area, respectively.

Then, using the gate electrodes 104*a*, 104*b* as an ion injection mask, the substrate 100 is ion-injected with boron (B) or phosphorous (P) to form impurity areas (not shown) in the substrate 100. Also, after a silicon nitride film is deposited on the substrate 100 having been formed with the gate electrodes 104*a*, 104*b*, the silicon nitride film is anisotropically etched to form gate spacers on side walls of the gate electrodes 104*a*, 104*b*.

Next, an insulating film consisting of an oxide is deposited on the substrate 100 and is then planarized by a chemical mechanical polishing (CMP) to form a first interlayer insulating film 110. Also, a photoresist pattern (not shown) for forming a bit line contact pad 112a and a lower electrode contact pad 112b is formed on the first interlayer insulating film 110. And the first interlayer insulating film 110 is partially etched to expose the impurity area (not shown) in the cell array area. Then a chemical vapor deposition (CVD) process is performed to deposit electrically conductive material over the entire surface. And a CMP process or an etch-back process is performed over the entire surface until the first interlayer insulating film 110 is exposed. In this way, the bit line contact pad 112a and the lower electrode contact pad 112b are formed. The so formed bit line contact pad 112a and lower electrode contact pad 112b are electrically connected to the impurity area (not shown). At this time, polysilicon, tungsten or the like may be used as the electrically conductive material for forming the bit line contact pad 112a and the lower electrode contact pad 112b.

Next, a second interlayer insulating film 120 is formed on the resultant product, and a photoresist pattern (not shown) for forming a bit line contact 122a in the cell array area and forming a wiring contact 122b in the peripheral circuit area is formed on the second interlayer insulating film 120. Then the second interlayer insulating film is partially etched to expose the bit line contact pad 112a And the second interlayer insulating film 120 and the first interlayer insulating film 110 in the peripheral circuit area are partially etched in sequence to expose the gate electrode 104b and the impurity area (not shown) in the peripheral circuit area. Thereafter, electrically conductive material is deposited and planarized over the entire surface to form the bit line contact 122a in the cell array area and to form the wiring contact 122b in the peripheral circuit area.

Next, an electrically conductive film is formed on the second interlayer insulating film 120, and a lithographic etching process is performed to form a bit line 124a and a peripheral circuit area wiring 124b. At this time, the bit line 124a and the peripheral circuit area wiring 124b disposed on the second interlayer insulating film 120 are electrically connected to the bit line contact 122a and the wiring contact 122b formed within the second interlayer insulating film 120, respectively. Also, a third interlayer insulating film 130 is formed on the entire surface of the resultant product.

Next, a photoresist pattern (not shown) is formed on the third interlayer insulating film 130. And the third interlayer insulating film 130 and the second interlayer insulating film 120 are partially etched in sequence to expose the lower electrode contact pad 112a located in a lower position. Also, a lower electrode contact 132 to be electrically connected to the lower electrode contact pad 122b is formed by depositing electrically conductive material on the entire surface of the resultant product and then performing a planarization process.

Next, a capacitor 140 is formed on the third interlayer insulating film 130. At this time, the capacitor 140 may be formed of various types, such as a stack type, a cylinder type and the like. In a preferred embodiment, the capacitor 140 is formed of the cylinder type.

To form the capacitor 140, a sacrificial film (not shown) used as a mold is formed on the third interlayer insulating film 13. An electrically conductive film for a lower electrode is deposited on side walls and the top of the mold. And then an insulating film (not shown) having good gap-filling characteristics is deposited on the electrically conductive film. Thereafter, a planarization process is performed until the sacrificial film is exposed, and the insulating film and the sacrificial film are removed to form a cylindrically-shaped lower electrode 142. Also, a dielectric film 144 and an electrically conductive film 146 for an upper electrode are deposited on the lower electrode 142 and then are patterned to complete the capacitor 140.

After the capacitor 140 disposed in the cell array area I is formed in this way, an insulating film consisting of an oxide is deposited on the entire surface of the resultant product. Also, a planarization process such as a CMP process or an etch-back process is performed to form a fourth interlayer insulating film 200. By this, the cell array area of the semiconductor device illustrated in FIG. 4A can be completed.

Figure 4B:
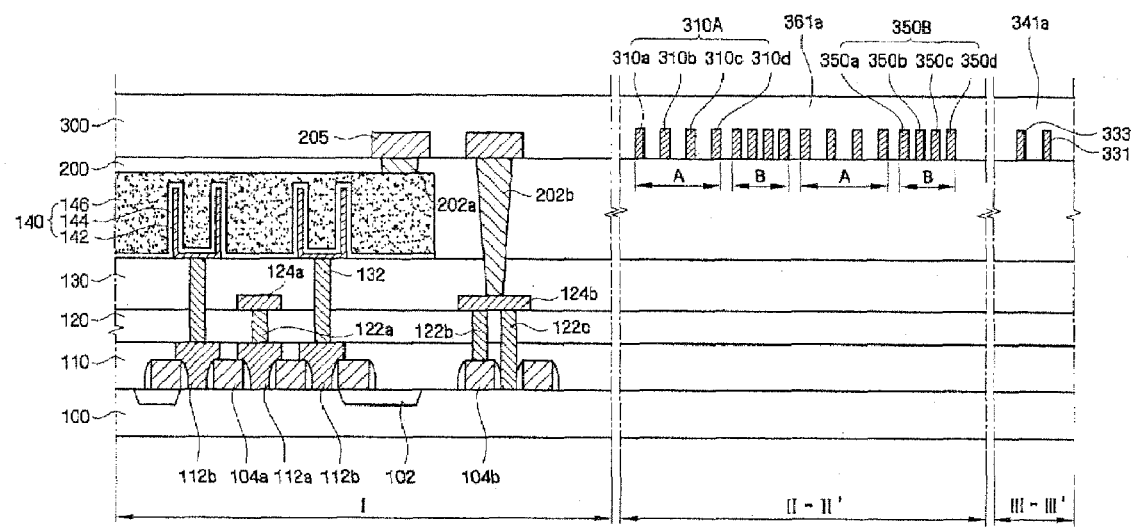

Next, as illustrated in FIG. 4B, a first insulating film 341a, 361a covering the fuse sections A, B is formed. Here, the first insulating film 341a, 361a may be formed of the same film material as that of the fifth interlayer insulating film 300 in the cell array area I. For example, the first insulating film 341a, 361a may be formed of a BSG (Borosilicate Glass) film, a PSG (PhosphoSilicate Glass) film, a BPSG (BoroPhosphoSilicate Glass) film, a USG (Undoped Silicate Glass) film, a TEOS (TetraEthylOrthoSilicate Glass) film, an O3-TEOS film, or a PE (Plasma Enhanced)-TEOS film, but the embodiments are not limited to this.

Figure 4C:
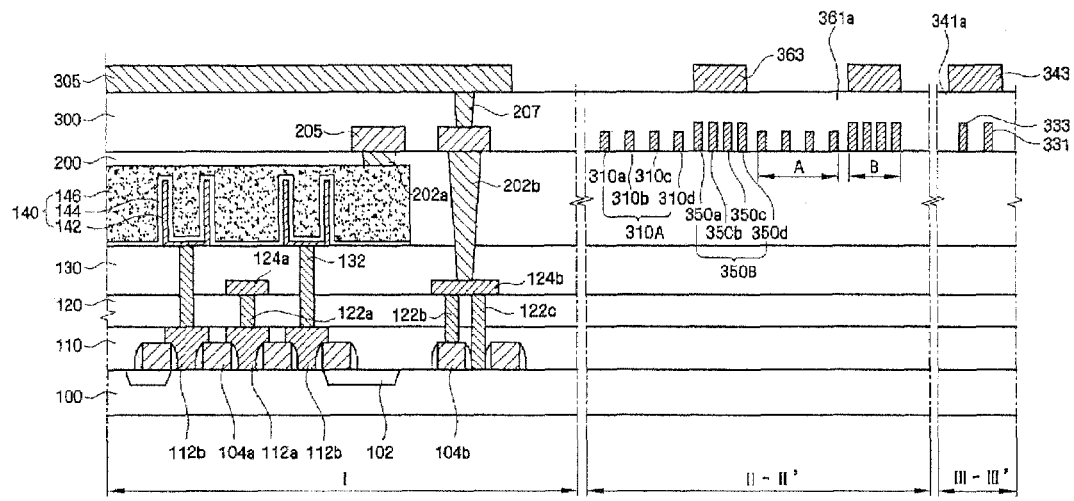

Next, as illustrated in FIG. 4C, electrically conductive film pattern portions 343, 363 are formed on the first insulating film 341a, 361a. Such electrically conductive film pattern portions 343, 363 may be formed so that their widths are substantially the same as or greater than those of the runner portions and the connection portions located therebelow. Also, the electrically conductive film pattern portions 343, 363 together with a second wiring 305 may be formed as the same electrically conductive film in the same layer when the second wiring 305 is formed on the fifth interlayer insulating film 300. The electrically conductive film pattern portions 343, 363 may be simultaneously formed above the runner portions and the connection portions, but it is obvious that they may be formed through separate processes if necessary.

Figure 4D:
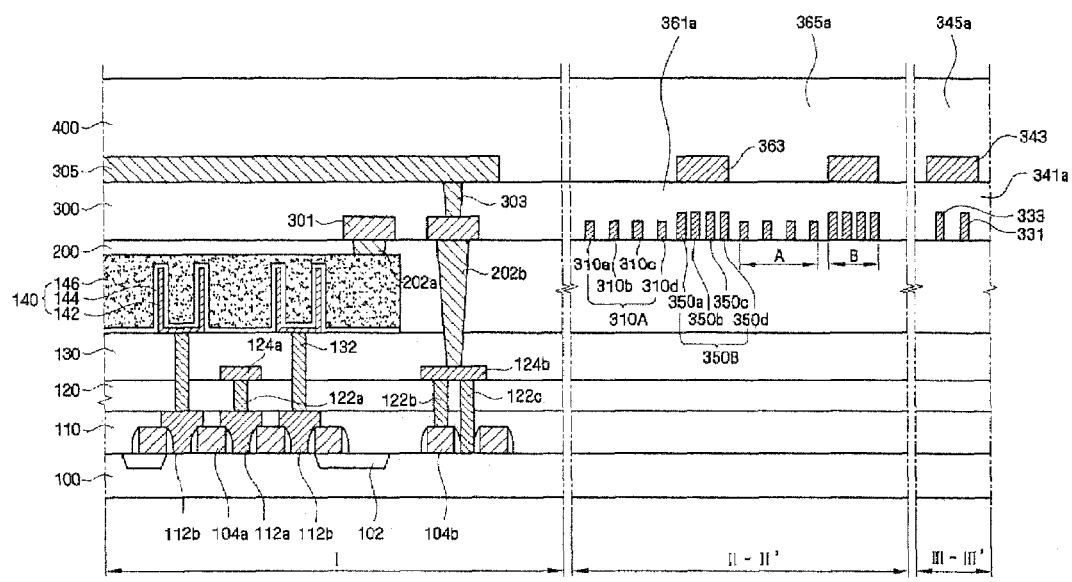

Next, as illustrated in FIG. 4D, a second insulating film 345a, 365a covering the electrically conductive film portions 343, 363 is formed. Such a second insulating film 345a, 365a may be a passivation layer 400 in the cell array area I.

Figure 4E:
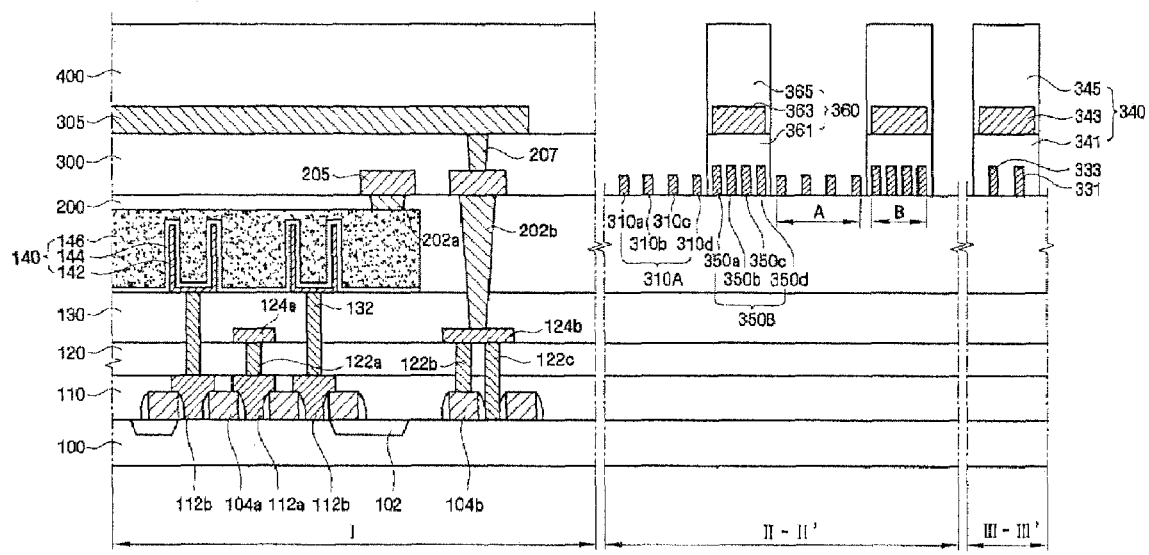

Next, as illustrated in FIG. 4e, the second insulating film 345a, 365a and the first insulating film 341a, 361a are sequentially patterned to complete a first insulating barrier layer 340 and a second insulating barrier layer 360. Through this patterning process, the respective fuse lines 310a, 310b, 310c, 310d of the fuse section A are exposed, and the fuse lines may be partially etched from the top surface to become lowered in height, if preferred.

At this time, the patterning process may be implemented by dry etching, by which second insulating film patterns 345, 365 covering upper surfaces and side surfaces of the electrically conductive film pattern portions 343, 363 are formed. Although not separately illustrated in the drawings, the electrically conductive film pattern portion 363 of the second insulating barrier layer 360 may be exposed in its upper portion according to a pattern of a mask film formed thereon.

As stated above, it may be advantageous, in view of the formation process, to simultaneously form the first and second insulating barrier layers 340, 360. However, the present invention is not limited to this, and the first and second insulating barrier layers 340, 360 may be formed in separate processes, respectively, if preferred.

As described above, the semiconductor device according to the embodiments can minimize leakage current occurrences caused by residues of metal patterns caused by a repair process, and therefore the reliability of the semiconductor device can be enhanced.

Although preferred embodiments have been described for illustrative purposes, those skilled in the art will appreciate that various modifications, additions and substitutions are possible, without departing from the essential features and the scope and spirit of the invention as disclosed in the accompanying claims. Therefore, it should be appreciated that the embodiments described above are not limiting, but only illustrative.

What is claimed is:

1. A semiconductor device comprising:
a first fuse section including a first fuse cutting portion, a first runner portion, and a first connection portion;
fuse lines in the first fuse cutting portion arranged transversely adjacent to each other;
runner lines in the first runner portion connected to the fuse lines, arranged transversely adjacent to each other but at smaller intervals than those of the fuse lines;
connection lines in the first connection portion between the fuse lines and the runner lines;
a second fuse section including a second fuse cutting portion that is transversely adjacent to the first runner portion, a second runner portion that is transversely adjacent to the first fuse cutting portion, and a second connection portion interconnecting the second fuse cutting portion and the second runner portion;
a first insulating barrier layer covering the first and second connection portions and exposing the first and second fuse cutting portions; and
a second insulating barrier layer covering the first and second runner portions.

2. The semiconductor device of claim 1, wherein the second insulating barrier layer includes a first insulating film pattern portion to insulate the respective runner lines.

3. The semiconductor device of claim 2, further comprising an electrically conductive film pattern portion formed on the first insulating film pattern portion.

4. The semiconductor device of claim 3, further comprising a second insulating film pattern portion on the electrically conductive film pattern portion.

5. The semiconductor device of claim 4, wherein the second insulating film pattern portion is a passivation layer pattern portion.

6. A semiconductor device comprising:
a first fuse section including a first fuse cutting portion, a first runner portion, and a first connection portion;
fuse lines in the first fuse cutting portion arranged transversely adjacent to each other;
runner lines in the first runner portion connected to the fuse lines, arranged transversely adjacent to each other but at smaller intervals than those of the fuse lines;
connection lines in the first connection portion between the fuse lines and the runner lines;
a second fuse section including a second fuse cuffing portion that is transversely adjacent to the first runner portion, a second runner portion that is transversely adjacent to the first fuse cutting portion, and a second connection portion interconnecting the second fuse cuffing portion and the second runner portion; and
a first insulating barrier layer covering the first and second connection portions and exposing the first and second fuse cutting portions,
wherein the first insulating barrier layer includes a first insulating film pattern portion for insulating the respective connection lines.

7. The semiconductor device of claim 6, wherein the first insulating barrier layer further includes an electrically conductive film pattern portion formed on the first insulating film pattern portion, and a second insulating film pattern portion on the electrically conductive film pattern portion.

8. The semiconductor device of claim 7, the second insulating film pattern portion is a passivation layer pattern portion.

* * * * *